United States Patent
Mai et al.

(10) Patent No.: US 8,790,498 B2
(45) Date of Patent: Jul. 29, 2014

(54) METHOD AND DEVICE FOR ION BEAM PROCESSING OF SURFACES

(75) Inventors: Joachim Mai, Nobitz (DE); Dietmar Roth, Oberlungwitz (DE); Bernd Rau, Chemnitz/OT Gruena (DE); Karl-Heinz Dittrich, Chemnitz (DE)

(73) Assignee: Roth & Rau AG, Hohenstein-Ernstthal (DE)

( * ) Notice: Subject to any disclaimer, the term of this patent is extended or adjusted under 35 U.S.C. 154(b) by 2287 days.

(21) Appl. No.: 10/578,047

(22) PCT Filed: Oct. 29, 2004

(86) PCT No.: PCT/DE2004/002436
§ 371 (c)(1),
(2), (4) Date: Aug. 7, 2007

(87) PCT Pub. No.: WO2005/042141
PCT Pub. Date: May 12, 2005

(65) Prior Publication Data
US 2008/0110745 A1 May 15, 2008

(30) Foreign Application Priority Data
Oct. 31, 2003 (DE) .................................. 103 51 059

(51) Int. Cl.
*C23C 14/34* (2006.01)

(52) U.S. Cl.
USPC ............ 204/192.34; 204/192.33; 204/298.32; 204/298.36; 250/492.21; 250/492.22; 250/492.23; 250/492.3

(58) Field of Classification Search
USPC ............. 204/192.33, 192.34, 298.32, 298.36; 250/492.21, 492.22, 492.3, 492.23
See application file for complete search history.

(56) References Cited

U.S. PATENT DOCUMENTS 3,699,334 A    10/1972    Cohen et al.
5,223,109 A *    6/1993    Itoh et al. ................. 204/192.34
6,274,007 B1 *    8/2001    Smirnov et al. .......... 204/192.13

FOREIGN PATENT DOCUMENTS

DE         39724         1/1964
DE     4108404      10/1991

(Continued)

OTHER PUBLICATIONS

May 21, 2003 "Reactive etching of semiconductor surfaces using an electronically chopped low energy broad beam ion source" J. Dienelt et al. Elsevier Science B.V., Surface and Coatings Technology vols. 174-175 pp. 157-161.

(Continued)

*Primary Examiner* — Rodney McDonald
(74) *Attorney, Agent, or Firm* — Jordan and Hamburg LLP

(57) ABSTRACT

A method and device for ion beam processing of surfaces of a substrate positions the substrate to face an ion beam, and a new technologically-defined pattern of properties is established. According to the method, the current geometrical effect pattern of the ion beam on the surface of the substrate is adjusted depending on the known pattern of properties and the new technologically-defined pattern of properties, and depending upon the progress of the processing, by modifying the beam characteristic and/or by pulsing the ion beam. A device for carrying out the method includes a substrate support for holding at least one substrate, which can be moved along an Y-axis and an X-axis, and an ion beam source for generating an ion beam, which is perpendicular to the surface to be processed of the substrate in the Z-axis or which may be arranged in an axis, inclined in relation to the Z-axis. The distance between the ion beam source and the surface to be processed of the substrate may be fixed or variable.

12 Claims, 2 Drawing Sheets

(56) References Cited

FOREIGN PATENT DOCUMENTS

| | | |
|---|---|---|
| DE | 19814760 | 10/1999 |
| EP | 0579524 | 1/1994 |
| EP | 1253619 | 10/2002 |

OTHER PUBLICATIONS

Jul. 17, 2003 "Generation of a pulsed ion beam with a tuned electronic beam switch" J. Dienelt et al. Plasma Sources Science and Technology vol. 12 pp. 489-494.

* cited by examiner

METHOD AND DEVICE FOR ION BEAM PROCESSING OF SURFACES

BACKGROUND OF THE INVENTION

The invention relates to a method for ion beam processing of the surface of a substrate in which the substrate is positioned relative to an ion beam that is generated by an ion beam source, and the known property pattern of the surface of the substrate is partially processed by the ion beam with a defined action pattern such that a new technologically defined property pattern of the surface is formed. The invention furthermore relates to an apparatus for performing the above mentioned method.

Property patterns of the surface of a substrate should be construed to mean all physical and chemical properties, as well as the surface topography, relative to defined surface area regions of the surface of a substrate. The action pattern of the ion beam contains the local ion current density distributions, with corresponding ion energy distribution, relative to defined surface area regions of the substrate that the ions of an ion beam act upon.

In accordance with the prior art, methods and devices are known in which an ion beam with constant beam characteristics is moved at a variable speed relative to the surface of a substrate that is to be processed. Beam characteristics include ion acceleration, ion energy distribution, ion current density, and ion density distribution of the ion beam ion. Also known, is the use of diaphragms between the ion beam source and the substrate.

Processing of the surface topography of a substrate is especially important, particularly for many aspects of micro- and nano-technologies. From targeted production of adjustable stratum thicknesses by thinning strata in thin film technology, to targeted removal of individual layers of atoms to nano-profiling of "high-grade" surfaces, all of these increasingly require the use of ion beams as a working tool.

In addition to geometrically modifying surface topography in the context of removing or coating, local modification of the properties of the surface is also important for micro- and nano-technologies. Thus, influencing the properties of the deposited stratum is known during ion beam-supported deposition methods when ions strike at the same time during the coating. Thus, for example, the density of the deposited stratum can be varied or the growth of the stratum can be changed from amorphous to crystalline, or the stoichiometry of the stratum can even be affected.

Targeted modification of surfaces using ion bombardment thereof is also possible. In this case, only the break-up of functional groups on the surface of plastic materials, for example, for modifying adhesive properties, and adding foreign atoms, e.g. for surface hardening, is cited.

DE 198 14 760 A1 describes, for example, a method for ion beam processing of solid surfaces with a beam having a rectangular cross-section. The ion beam source, controlled by a computer at a pre-specified starting angle, is guided over the workpiece surface with translatory movements of fixed or variable distance with variations in speed depending on the position, ion beam parameters, and material properties.

The object of the invention is to provide a method for ion beam machining of surfaces of the type cited in the foregoing, with which high efficacy is attained and with which technical complexity is low. The object is furthermore to provide a device for performing such method.

SUMMARY OF THE INVENTION

The invention attains the object for the method by positioning the substrate relative to an ion beam that is generated by an ion beam source, partially processing a known property pattern of the surface of said substrate by said ion beam such that a new technologically defined property pattern is formed, and adjusting a current geometric action pattern of said ion beam on said surface of said substrate as a function of the known property pattern and of the new technologically defined property pattern, and as a function of the method progress by at least one of modifying the beam characteristics or by pulsing the ion beam. With regard to the device for performing the method, the object is obtained in an apparatus including a substrate support for mounting at least one substrate presenting a surface, the substrate support being disposed within a vacuum chamber and being movable in a Y axis and in an X axis. The apparatus also includes an ion beam source which is mounted in a wall of the vacuum chamber such that an axis of an ion beam from the ion beam source is perpendicular to the surface of the substrate to be processed in a Z axis or is positionable in an axis that is inclined to the Z axis, such that a distance from the ion beam source to the surface of the substrate to be processed is fixed or variable.

In accordance with the invention, the technologically necessary effect of the ion beam on the surface of the substrate is adjusted by means of modifying the beam characteristics and/or by pulsing the ion beam as a function of the known property pattern of the surface and of the new technologically defined property pattern of the surface to be produced depending on the progress of the method. The current geometric action pattern of the ion beam on the surface of the substrate (i.e., from a wide-beam ion source) is adapted to the current known property pattern of the surface. The change in properties in defined surface regions by the ion beam is then determined using temporally controlled beam characteristics.

According to the invention, the ion beam source, and thus the ion beam, can be fixed relative to the surface of a substrate to be processed, or alternatively can also be moved.

Suitable methods and devices for detecting the property pattern of the surface of the substrate and for in situ detection of the current action pattern of the ion beam for modifying the ion beam characteristics during the course of the method are known from the prior art.

In particular for processing larger substrates or substrate arrangements, it is advantageous to arrange at least two individual ion beam sources in combination, such that the individual ion beams together form the geometric action pattern of the ion beam according to the invention.

In accordance with a further embodiment of the invention, the ion beam of the individual ion beams can also be pulsed simultaneously or temporally offset from one another. The pulse frequency, pulse height, and pulse duration are freely programmable corresponding to the technical capabilities.

For specific tasks, in accordance with another embodiment, the angle between the surface normal of the surface of the substrate to be processed and the axis of the ion beam striking the surface can also be modified.

Knowledge of the beam characteristics as a function of certain control parameters for the ion beam source and the temporal stability of the beam characteristics are critical for defined reproducible ion beam processing.

For detecting the ion beam on the surface of the substrate prior to and/or during the method, according to another embodiment, it is advantageous to arrange an ion probe array, with which the geometric effect of the ion beam is measured, in the plane of the surface of the substrate to be processed.

Thus it is possible at any time to determine the momentary beam characteristics and consequently, when required, to make necessary corrections. Automatic regulation for correcting the beam characteristics or auxiliary calculation of the travelling conditions of the substrate for attaining the target pattern are also possible.

In accordance with yet another advantageous embodiment, an apparatus is provided for performing ion beam processing of the surface of a substrate in accordance with one of the inventive methods in which substrate and ion beam source are moved relative to one another. The apparatus is arranged within a vacuum chamber and contains a substrate support for mounting at least one substrate that can be moved in a Y axis and in an X axis. The ion beam source is mounted in the wall of the vacuum chamber such that the axis of an ion beam from the ion beam source is perpendicular to the surface of the substrate to be processed in the Z axis or can be arranged in an axis that is inclined to the Z axis. The distance from the ion beam source to the surface of the substrate to be processed can be fixed or variable.

In one further development of the apparatus, the ion beam source can comprise at least two individual ion beam sources, the individual ion beams of which form a common current geometric action pattern of the ion beam on the surface of the substrate.

Significant advantages can be obtained compared to the prior art using the method according to the invention and with the associated apparatus. No complex movement devices of diaphragms are necessary for a plurality of substrates, in particular, smaller substrates or substrate arrangements. If movement between substrate and ion beam source is technologically required, it is normally sufficient to provide a uniform movement that is likewise substantially simpler to realize than a translatory movement with variations in speed.

The substrate and ion beam source can also be arranged in a grid pattern relative to one another. This can also be very advantageous in combination with pulsing the ion beam, for example, when a plurality of substrates are to be processed in a continuous method.

If, for example, temporally stable beam characteristics of the ion beam are turned on and off in a temporally variable time grid by means of electrical control parameters, when there is simultaneous and uniform substrate movement, surface processing that is a function of the locally effective exposure time action duration of the ion beam can be attained. The ion beam can also be turned on and off in a temporally variable time grid when beam characteristics of the ion beam source are temporally variable while the substrate movement is uniform. Simultaneous with the variable beam characteristics and the pulsing of the control variables for the ion beam source, there is the option of ion beam neutralization. An electron extraction is performed when the ion beam is blocked.

Particularly flexible ion beam processing can be attained with a method performed in this manner, even when different substrate materials are used, for example, when different property regions that have very different dimensions are to be produced within the substrate surface. The accuracy of the processing and also the processing speed can be advantageously adapted to the local property pattern to be attained using the temporally variable beam characteristics.

The invention is described in more detail in the following using an exemplary embodiment with reference to the accompanying figures.

BRIEF DESCRIPTION OF THE DRAWINGS

FIGS. 1a and 1b depict a substrate with a coating, in which FIG. 1a illustrates the coating prior to ion beam processing and FIG. 1b illustrates the coating after ion beam processing.

DETAILED DESCRIPTION OF THE INVENTION

Exemplary embodiment I

Figure 1A:
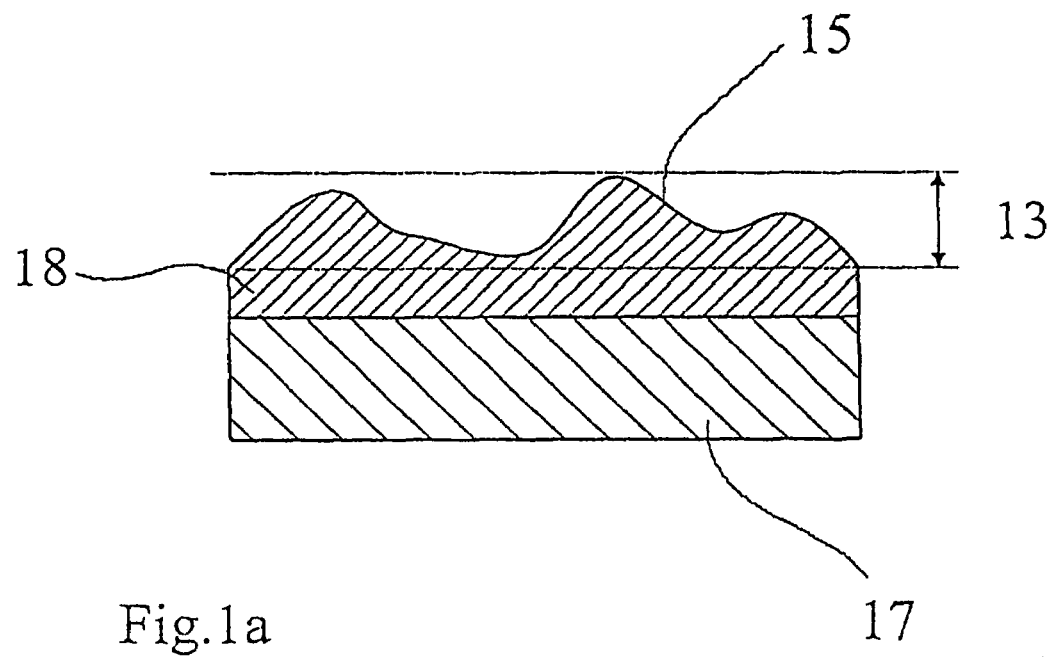
Figure 1B:
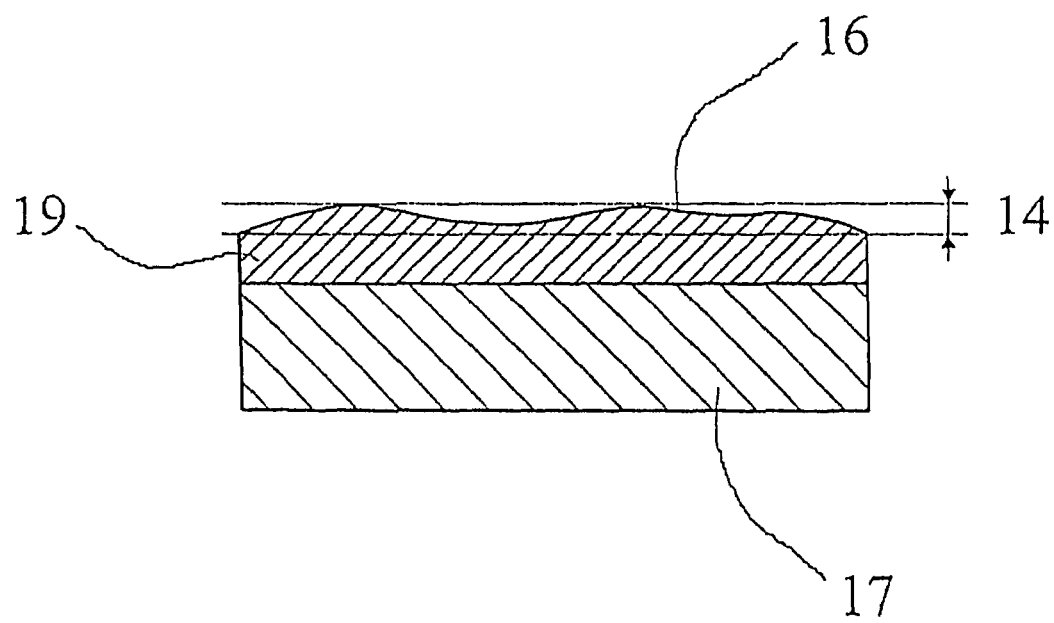
Figure 2:
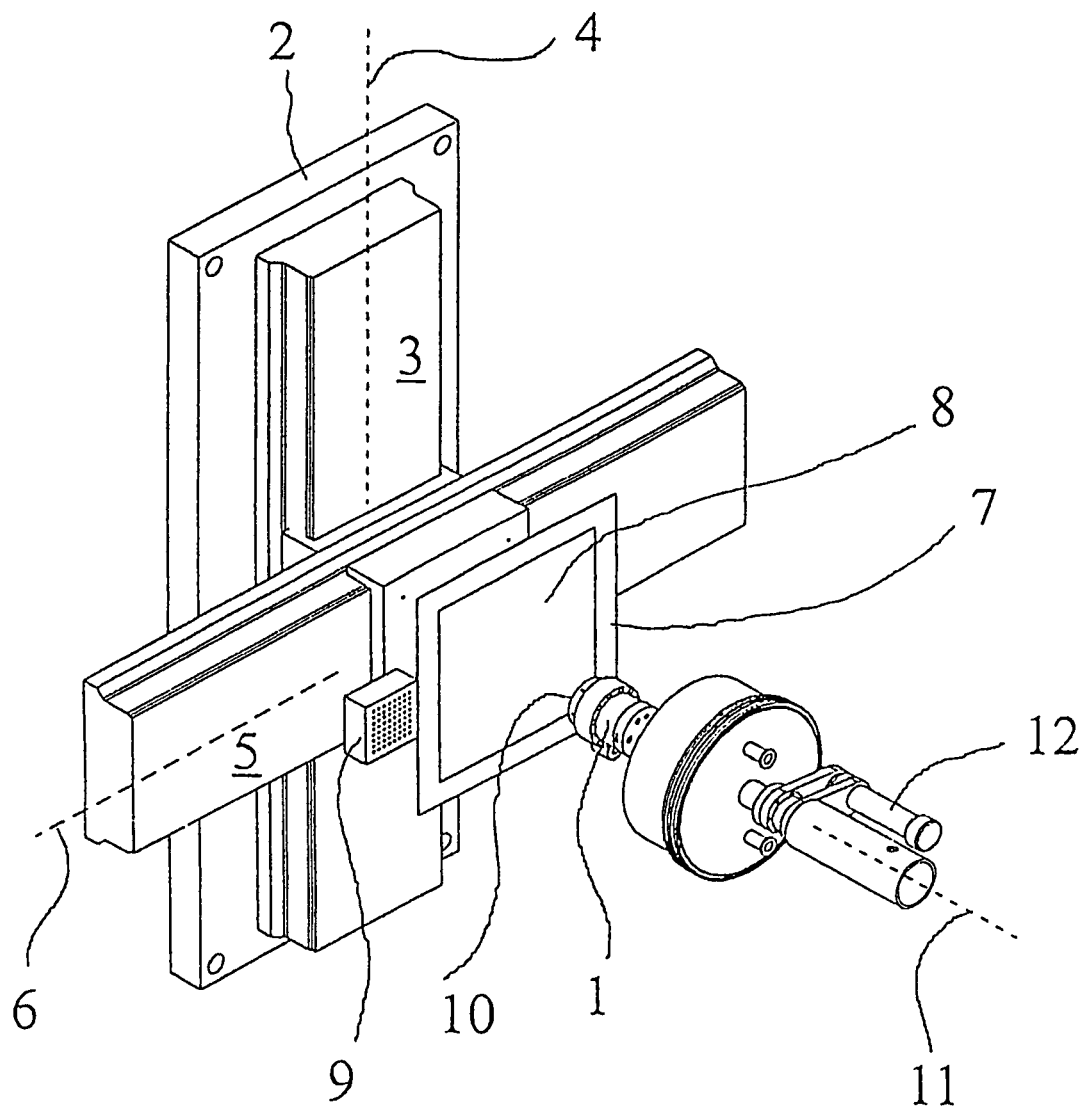
FIG. 2 depicts an apparatus for ion beam processing of the substrate in accordance with FIGS. 1a and 1b.

Starting with a substrate 8 comprising a base 17 on which a stratum 18 with a surface 15 according to FIG. 1a is present, the surface 15 is to be processed with a method according to the invention and the device in accordance with FIG. 2 of the invention such that a smoothed surface 16 of the now new stratum 19 according to FIG. 1b is produced.

The apparatus according to the invention as depicted in FIG. 2 essentially comprises a substrate support within a vacuum chamber (not shown) and an ion beam source 1 that is mounted in the wall of the vacuum chamber by means of a vacuum flange such that the required control elements are largely disposed outside of the vacuum chamber.

The substrate support comprises a mounting plate 2 on which a guide rail 3 having a Y axis 4 is held, a guide rail 5 that has an X axis 6 and that is displaceable on the guide rail 3 in the Y axis 4, and a substrate holder 7 that can be displaced on the X axis 6 and that can be rotated about its own center axis (Z axis 11). The substrate 8 is held on the substrate holder 7.

Provided in the plane of the substrate 8 on the substrate holder 7, is an ion probe array 9, that comprises two columns with eight ion probes each, and that is moved with the substrate holder 7. The ion probe array 9 enables rapid and secure control and measurement of the beam characteristics as a function of on the control parameters of the ion beam source 1 without interfering with the vacuum.

In a known manner, the ion beam source 1 comprises the necessary electrical elements for producing an ion beam that has defined geometric beam characteristics and that leaves the ion beam source 1 (e.g., a wide-beam ion source) at the ion discharge aperture 10. Outside of the vacuum chamber, the Z axis 11 has a motor 12 with a corresponding transmission gear for displacing the ion beam source 1 in the Z axis 11. An associated control unit is not shown in the drawing.

The substrate 8 can be moved relative to the ion beam source 1, programmed in any desired manner, with the apparatus in accordance with FIG. 2.

All important grid voltages for the ion beam source 1 can also be pulsed according to the technical options. Thus, both a complete temporal blockage of the ion beam during ion beam processing and a temporally coordinated variation are possible, whereby the period and the pulse duration are freely variable in a broad range.

The vacuum pump system, gas supplies, including reactive gases, and apparatus for heating or cooling individual assemblies or the substrate 8 complete the apparatus.

Application of the apparatus is described in greater detail in the following. The surface 15 of the stratum 18 in accordance with FIG. 1a is to be leveled corresponding to prespecified technological parameters so that the surface 16 on the now new stratum 19 is then embodied according to FIG. 1b.

The base 17 of the substrate 8 in the example is a silicon wafer and an aluminum layer is present as stratum 18. The diameter of the substrate 8 is 150 mm. The mean stratum thickness homogeneity of the applied aluminum layer is approximately +/−10% at a mean stratum thickness of approximately 500 nm. The original roughness 13 of the surface (FIG. 1a) is to be reduced to a defined roughness 14 (FIG. 1b).

The local stratum thickness profile is initially determined by means of a surface resistance measurement and stored in a measurement matrix. The grid for the measurement matrix is 2×2 mm.

The substrate 8 was affixed to the substrate holder 7 defined and aligned, which provides a direct assignment of each measurement point of the measurement matrix to the X axis 6 and Y axis 4 (coordinates).

The ion discharge aperture 10 for the ion beam source 1 has a diameter of 40 mm. The distance between ion discharge aperture 10 and surface 15 of the substrate 8 is about 85 mm.

After the vacuum chamber has been evacuated and the ion beam source 1 has attained operational readiness, the ion probe array 9 on the substrate holder 7 is driven into the ion beam and the beam characteristics of the ion beam are measured and where required adjusted according to technological need. The beam characteristics are adjusted, for instance, such that at an ion energy of approximately 800 eV, a Gauss distribution of the ion current density can be attained with a width at half maximum of 12 mm and a maximum ion current density of approximately 2.5 mA/cm$^2$.

Using a calculation program, for producing a locally required removal rate for the ion beam on the surface 15, a control matrix with the values for the pulse frequency between 500 Hz and 20 kHz and the pulse length ratio of 0.2 to 0.98 is stored in a control unit. Moreover, necessary uniform traveling speeds and row distances that are necessary for processing accuracy are entered into the control matrix.

During the surface processing, the ion beam is completely blocked or is pulsed using a time matrix depending on the traveling speed. During the course of the method, linearization of the surface 16 (FIG. 1b) with homogeneity of less than +/−1% and a processing time for the substrate 8 of approximately 10 min. is attained using this procedure.

Typically the target profile for the surface 16 is adjusted with a deviation of less than +/−5 nm. The accuracy of the ion beam processing can even be clearly further increased or the processing time can even be further reduced using a highly-effective computing program and by optimizing the defined beam characteristics of the ion beam.

The invention can be varied in an extraordinarily comprehensive manner based on the disclosure herein. Thus, it is possible, with nothing further, to adapt the ion beam to the respective substrate arrangement, for example, a relatively wide ion beam can also be provided for continuous systems for ion beam processing.

The invention claimed is:

1. An ion beam processing method for changing surface properties of a substrate from a known pattern of properties to a new technically defined pattern of properties, comprising:
positioning the substrate relative to an ion beam that is generated by an ion beam source;
measuring a current geometric action pattern of the ion beam with an ion probe array during processing of the substrate; and
adjusting the geometric action pattern of said ion beam based on the measured geometric action pattern and the known pattern of properties, said adjusting comprising varying local ion current density distributions within an ion beam cross section, thereby causing a corresponding variation of ion energy distribution at defined surface area regions of the substrate that ions of the ion beam act upon;
wherein the current geometric action pattern of said ion beam on the surface of the substrate is measured prior to and/or during the course of said method by the ion probe which is arranged in a plane of the surface of the substrate to be processed.

2. A method according to claim 1, wherein said substrate and the ion beam source rotate relative to one another and/or are moved uniformly or non-uniformly linearly, in a circle, or in a technologically pre-specified direction.

3. A method according to claim 1 or 2, wherein said measuring and adjusting is performed for at least two individual ion beams having respective beam characteristics which are controlled synchronously.

4. A method according to claim 1 or 2, wherein an angle between a surface normal of said surface of said substrate to be processed and the axis of said ion beam striking said surface is modified.

5. A method according to claim 1, wherein said ion beam source is a wide-beam ion source.

6. A method according to claim 3, wherein an angle between a surface normal of said surface of said substrate to be processed and the axis of said ion beam striking said surface is modified.

7. An apparatus for ion beam processing of a surface of a substrate, comprising:
a substrate support for mounting at least one substrate presenting said surface, said substrate support being disposed within a vacuum chamber and being movable in a Y axis and in an X axis;
an ion beam source being mounted in a wall of said vacuum chamber such that an axis of an ion beam from said ion beam source is perpendicular to said surface of the substrate to be processed in a Z axis or is positionable in an axis that is inclined to said Z axis, such that a distance from said ion beam source to said surface of said substrate to be processed is fixed or variable;
an ion probe array arranged in a plane of the substrate surface and positioned to measure a current geometric action pattern of the ion beam; and
means for adjusting the geometric action pattern of said ion beam prior to and during said ion beam processing of said substrate surface based on the measured geometric action pattern and a known pattern of properties of the substrate surface, said adjusting means varying local ion current density distributions within an ion beam cross section, thereby causing a corresponding variation of ion energy distribution at defined surface area regions of the substrate that ions of the ion beam act upon.

8. An apparatus according to claim 7, wherein said ion beam source is formed from at least two individual ion beam sources, the individual ion beams of which form a common current geometric action pattern of said ion beam on said surface of the substrate.

9. An apparatus according to claim 7, wherein said ion beam source is a wide-beam ion source.

10. An apparatus according to claim 7, wherein the ion probe array is arranged in a plane of the surface of the substrate to be processed.

11. A method according to claim 1, further comprising:
producing a geometric action pattern at the substrate surface by varying ion acceleration, ion energy distribution, ion current density, and ion density distribution of the ion beam; and
wherein said adjusting the geometric action pattern is performed as a function of the known pattern of properties, the method progression, and the current geometric action pattern of the ion beam to achieve the new technically defined pattern of properties.

12. An apparatus according to claim 7, in which said adjusting means varies ion acceleration, ion energy distribution, ion current density, and ion density distribution of the ion beam to achieve the adjusted geometric pattern.

* * * * *